United States Patent [19]
Dixon

[11] 3,958,740
[45] May 25, 1976

[54] AUTOMATIC COMPONENT ASSEMBLY MACHINE AND METHOD RELATING THERETO

[75] Inventor: Kenneth K. Dixon, Rancho Palos Verdes, Calif.

[73] Assignee: Dixon Automation, Inc., Torrance, Calif.

[22] Filed: July 8, 1974

[21] Appl. No.: 486,520

[52] U.S. Cl. .......................... 228/102; 228/180 A; 228/6 A; 228/7; 228/36
[51] Int. Cl.² ........................................ H01L 21/58
[58] Field of Search ................... 228/4, 6, 7, 33, 35, 228/36, 49, 102, 180, 256; 29/203 B, 203 R, 470.1, 470.3

[56] References Cited
UNITED STATES PATENTS

| | | | |
|---|---|---|---|
| 2,918,028 | 12/1959 | Wright | 228/35 X |
| 3,453,714 | 7/1969 | Clark et al. | 228/6 X |
| 3,475,805 | 11/1969 | Rottmann | 29/203 B |
| 3,479,716 | 11/1969 | Zanger et al. | 29/203 R |
| 3,581,375 | 6/1971 | Rottmann | 29/203 B |
| 3,648,915 | 3/1972 | Leibfried et al. | 228/36 X |
| 3,700,155 | 10/1972 | Hermanns | 228/4 X |
| 3,722,062 | 3/1973 | Gharaibeh | 228/203 B |
| 3,733,672 | 5/1973 | Bohannon et al. | 29/203 B |
| 3,740,817 | 6/1973 | Weiler et al. | 29/203 B |
| 3,744,032 | 7/1973 | Engelberger et al. | 340/172.5 |

Primary Examiner—Al Lawrence Smith
Assistant Examiner—K. J. Ramsey
Attorney, Agent, or Firm—Forrest J. Lilly

[57] ABSTRACT

A programmable manipulation machine for picking up a succession of small components, such as semiconductor chips, and placing them precisely in predetermined positions on a work-piece, such as a substrate. The machine includes a vacuum chuck assembly which is movable by a servomotor along a relatively long horizontal axis between a chip pick-up station and a dip assembly station and which is also movable, by means of digital stepper motors, linearly in a transverse horizontal axis and a vertical axis, and rotationally about the vertical axis. Also included are a substrate-supporting work table which is also movable, by means of a digital stepper motor, in the transverse horizontal direction, and a control unit for direction and sequencing movement of the chuck assembly and work table in accordance with operator-changeable positional data stored in a memory associated with each movement axis. A dip station, including a rotating dip wheel partially immersed in a dip bath, located between the pick-up and assembly stations, is optionally employed to apply a coating of solder paste or adhesive paste to the chips.

17 Claims, 18 Drawing Figures

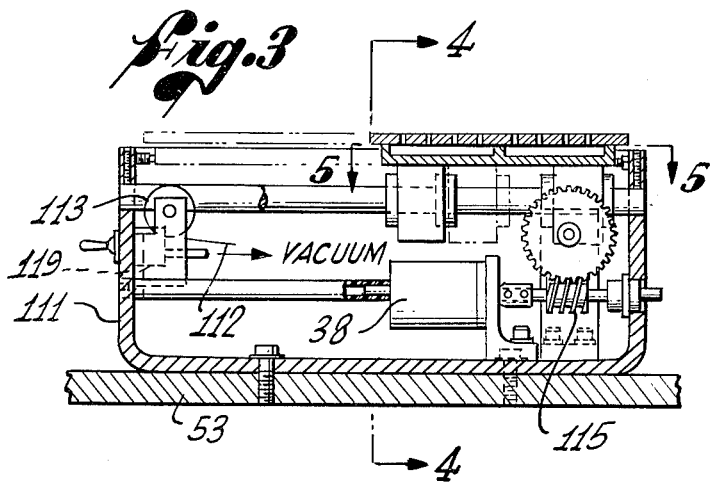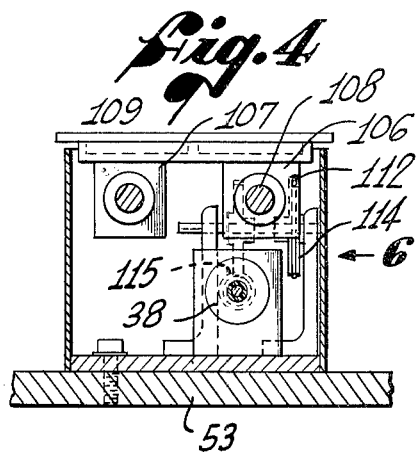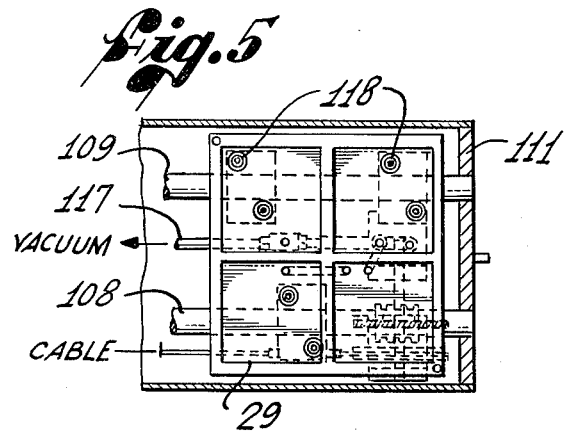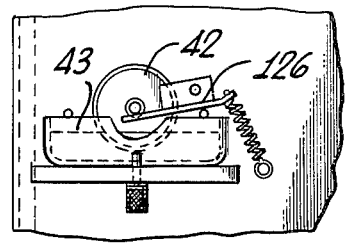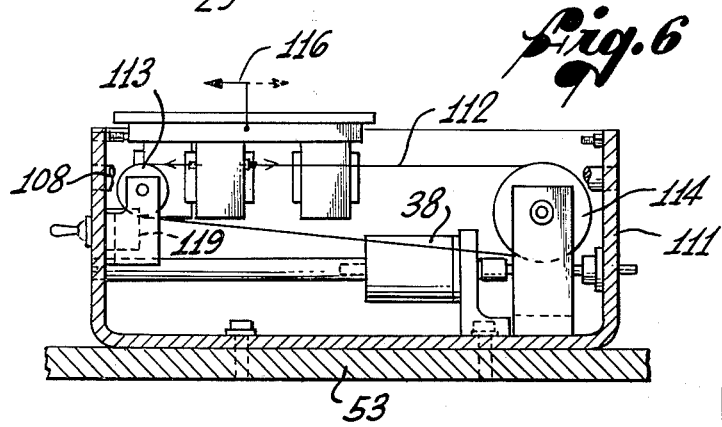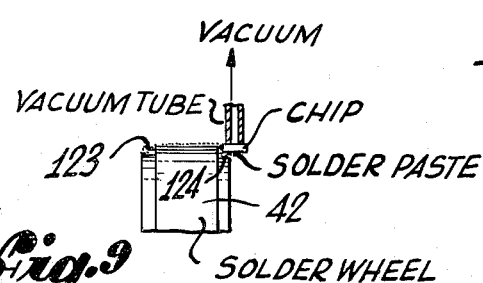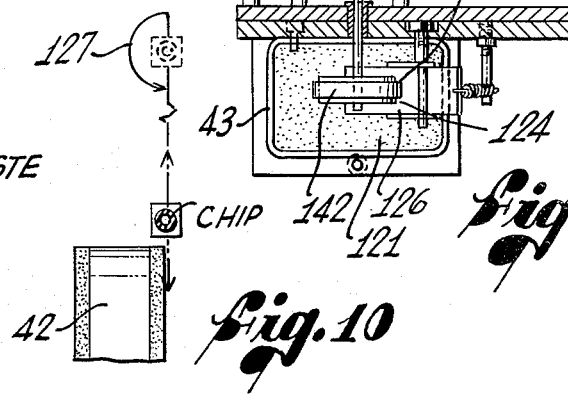

AUTOMATIC COMPONENT ASSEMBLY MACHINE AND METHOD RELATING THERETO

BACKGROUND OF THE INVENTION

This invention relates generally to automatic assembly machines for picking up and placing component parts in an assembly process. More particularly, the invention relates to such automatic machines used in the fabrication of micro-electronic or hybrid circuitry requiring the accurate placement of integrated-circuit or discrete-component chips onto a substrate.

In the fabrication of hybrid circuitry, there is a requirement for extremely accurate placement of a plurality of chips on a substrate, prior to bonding of the terminals or leads of each chip to appropriately connect it with other components on the substrate. A chip may be placed directly on the substrate, or it may be held in place by solder paste applied to selected faces or edges of the chip, or by an epoxy adhesive which may serve as an electrical connection, a heat sink, or both. The chips are generally of various sizes, from a few hundredths of an inch to a few tenths of an inch square, and they must be positioned on the substrate at various positions to an accuracy of a few thousandths of an inch. Fabrication of a single chip-substrate assembly includes the steps of picking up a plurality of chips of different sizes, applying solder paste or epoxy to the chips as required, and accurately positioning the chips, each at its designated position on the substrate. This positioning accuracy has to be precisely repeatable at a rapid rate, so that relatively high production capacities may be reached.

Chip placement machines of the prior art generally operate on an "assembly line" principle, wherein a substrate is indexed, on some type of conveyor, through a succession of work stations at which the chips are accurately positioned by appropriate feeding and positioning means. Before being operated at production speeds, such a machine has to be carefully "set up" so that the chip positioning means at each work station places a chip at exactly its desired position on the substrate.

Chip placement machines of the foregoing general type are satisfactory for long production runs on a particular chip-substrate assembly, but the need for careful and painstaking set-up of the machine prior to each production run makes it less satisfactory for medium and short production runs.

Two other manufacturing or machine-tool techniques which might be applied to the chip assembly process are numerical control, and manipulation by programmable machines, sometimes referred to as robots. The numerical control technique is normally "externally" programmed, i.e., the movements of a tool or work-piece are preprogrammed and encoded on paper tape, magnetic tape, or some other medium external to the machine. However, differences between theoretical and actual displacements can result in substantial positional errors, and numerical control has not been successfully adapted to the chip assembly process.

In programmable manipulators, or robots, desired movements of a tool or work-piece are programmed by "walking" the machine through the movements and recording the various parameters or co-ordinates of the movements in an internal storage or memory. The movements can be, in effect, "played back" repeatably any number of times, thereby performing the programmed functions at a much higher speed than could be attained by a human operator. This type of manipulator has been used extensively in automobile manufacture, particularly for spot welding of car bodies. Such manipulators used for spot welding generally control the movement of a pair of welding electrodes on a pivoted and extendable arm. The accuracies required for spot welding operations are, of course, much less demanding than those required for chip assembly processes, and no known chip assembly machine available heretofore operates on the programmable manipulator principle.

Although the programmable manipulator has inherent advantages, such as absolute repeatability and ease of programming, its application to the chip assembly process is made difficult by the stringent requirements of that process. Basically, these requirements are threefold. First, the capability of movement of the chips to the substrate must be such that a satisfactorily high production rate is obtained. Second, the positioning of the chips must be highly accurate, preferably to within 0.002 inch. Finally, the machine must be capable of picking up very small components of variable size, processing them at an intermediate station, and transferring them to desired positions on the substrate.

It will be appreciated from the foregoing that there is a real need in the hybrid circuitry fabrication art for a chip assembly machine which utilizes the principles of programmable manipulators, which may be easily operated by relatively unskilled operators, and which, therefore, may be efficiently utilized for medium and short production runs, as well as long production runs. The present invention satisfies this need.

SUMMARY OF THE INVENTION

The present invention resides in a programmable manipulator or assembly machine for the accurate placement of a plurality of small component parts, such as semiconductor chips, of various sizes on a larger work-piece, such as substrate. The invention employs a chuck means which is selectably movable along a direction parallel to any of three orthogonal axes and is rotatable about one of the axes, and a work table for supporting the work-piece, the work table being also selectably movable in a direction parallel to one of the axes.

Basically, and in general terms, the apparatus of the invention includes a pick-up station toward which a plurality of the small component parts or chips are fed automatically; an assembly station which includes the work table; and the chuck means, which includes a selectively actuable chuck for picking up the chips at the pick-up station and releasing them at the assembly station. Basic to the invention are means for moving the chuck along a direction parallel to a first axis between the pick-up and assembly stations; means for moving the chuck along directions parallel to second and third axes orthogonally related to the first axis; means for rotating the chuck about one of the axes; and means for moving the work table along a direction parallel to the second or third axis. Control means are also included, to control the sequence of movements of the chuck in picking up and accurately placing a plurality of chips on a substrate.

According to one aspect of the invention, the combination of the axes of movement of the chuck and the work table, and the means for effecting movements along these axes, is a novel and an optimum combination satisfying the stringent requirements of the chip assembly process. Thus, for example, chuck movement in the direction of the first axis, which is normally horizontal, between the pick-up and assembly stations, is achieved at a relatively fast speed to ensure a relatively high production rate. Movement in the direction of the second axis, which is normally vertical, is provided to effect pick-up and release of the chips; and movement in the direction of the third axis, which is normally a transverse horizontal axis, i.e., at right-angles to the first axis, is limited to a relatively small displacement from the first axis, in order to ensure accuracy and to reduce weight requirements and inertia effects for the rapid movements along the first axis. This third axis is required to allow pick-up of various sizes of chips. Rotation about the second axis is provided to allow correct angular orientation of the chip with respect to the substrate; and movement of the work table, in the direction of the third axis, is required to locate the substrate and chips relative to each other, since the chuck itself is capable of only limited movement in this direction.

It can be seen that there are a total of five degrees of freedom or modes of movement of the chuck and the work table: movement of the chuck along any of the three orthogonally related axes, rotation of the chuck about one of the axes, and movement of the work table along a separate axis. This arrangement provides for a relatively high translation speed over the relatively great distance between the pick-up and assembly stations, yet provides extremely high accuracy of chip position and orientation of the two stations. In a presently preferred embodiment of the invention, high-speed movement along the first axis is effected by means of a servo-motor acting in conjunction with digital encoding means to provide an indication of actual position of the chuck. Movement in each of the other four modes is effected by means of a digital stepper motor coupled with a digital position counter to record actual position.

In accordance with another aspect of the invention, a dip station is provided, at a location intermediate the pick-up and assembly stations, for the application of solder paste, solder flux, conductive epoxy, or adhesive to the chips. In brief, the dip station comprises a dip-wheel rotatable about a horizontal axis, with part of its circumference immersed in solder paste or adhesive paste. The paste is picked up by the rotating wheel in a circumferential groove and applied to the chip as the latter is moved along the first axis tangentially to the groove at a controlled speed. The chuck may be programmed to make two passes through the dip station, with the chip being rotated 180 degrees between passes to allow application of paste to two edges or faces of the chip.

In the presently preferred embodiment, the invention may be operated in a "program" mode wherein certain steps of the chuck's movement may be "walked through" using manual controls to make appropriate adjustments to the position and orientation of the chuck and work table, and utilizing other manual controls to record the adjusted positions for subsequent automatic operation of the apparatus.

In accordance with the method of the present invention, a plurality of chips are assembled on a substrate by following the steps of: picking up a chip from the pick-up station by moving the chuck as required in the three orthogonally-related axes and actuating the chuck to grip the chip; raising the chip from the pick-up station; moving it along a horizontal axis to the substrate; positioning it with respect to the substrate by lowering the chuck and moving the substrate table transversely; releasing the chip; and repeating the sequence for other chips to be located at other desired locations. In addition, the chip may be rotated to a desired angular orientation with respect to the substrate, and may be coated with a paste on one or more of its faces or edges.

It will be appreciated from the foregoing that the present invention represents a significant advance in the field of chip assembly machines, in that it provides an easily programmable machine for rapid and extremely accurate assembly or placement of chips on a substate. In particular, the invention's arrangement of five axes or modes of movement provides an optimum solution to the problems posed by the stringent requirements of the chip assembly process.

Other aspects and advantages of the invention will become apparent from the following more detailed description taken in conjunction with the accompanying drawings.

BRIEF DESCRIPTION OF THE DRAWINGS

FIG. 3 is a longitudinal vertical sectional view of the work table mechanism of the machine, taken substantially along the line 3—3 of FIG. 2, and with the work table shown in a fully extended position;

FIG. 4 is a cross-sectional view of the work table mechanism taken substantially along the line 4—4 of FIG. 3;

FIG. 5 is a horizontal sectional view of the work table mechanism taken substantially along the line 5—5 of FIG. 3;

FIG. 6 is an elevational view of the work table mechanism taken in the direction of the arrow 6 in FIG. 4, but with the work table shown in a fully withdrawn position;

FIG. 7 is a fragmentary elevational view of the dip station included in the machine of FIG. 1;

FIG. 8 is a plan view of the dip station of FIG. 7;

FIG. 9 is an enlarged fragmentary elevational view showing the positional relationship of a chip to a groove on the dip wheel at the dip station;

FIG. 10 is a plan view of the chip and wheel as shown in FIG. 9;

DESCRIPTION OF THE PREFERRED EMBODIMENT

Figure 1:
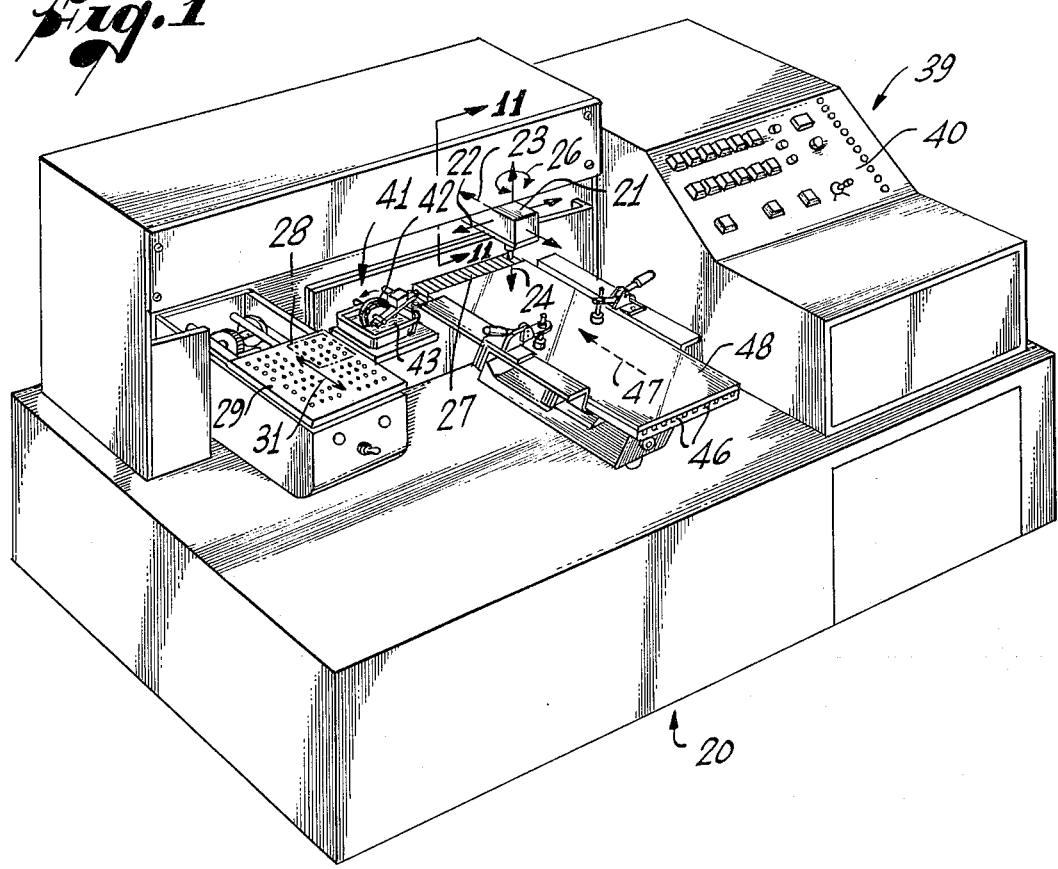
FIG. 1 is a perspective view of a chip assembly machine embodying features of the present invention.

As shown in the drawings for purposes of illustration, the present invention is embodied in a chip assembly machine, generally indicated by the reference numeral 20 in FIG. 1, for use in the manufacture of micro-electronic or hybrid circuitry requiring the accurate placement of a plurality of integrated-circuit or discrete-component chips at predetermined locations on a substrate. The chip assembly process includes the picking up of chips of varying physical dimensions, optionally coating them on one or more faces with an adhesive or solder paste, and placing them accurately on a substrate. Ideally, an automated machine for performing this process should be fast in its movements, to provide a desirably high production rate, accurate to within a few thousandths of an inch, and easily adaptable to handle a mixture of chip sizes and various sequences of assembly movements required for various chip-substrate assemblies.

In accordance with the present invention, a chuck assembly 21 for picking up and holding chips is movable along any of three generally orthogonally related axes 22, 23 and 24 and is rotatable about one of the axes 24, as shown by numeral 26, all movements being in accordance with a predetermined plan or program to effect picking up chips one-by-one from a feed-table 27, and moving them to and placing them accurately on a substrate, shown in outline at 28, secured to a worktable 29, which is also programmably movable back and forth along an axis 31 parallel to axis 23.

The axis 22, which is a horizontal axis referred to hereinafter as the Y axis, is the principal axis along which the chuck assembly 21 must travel between the feed table 27 and the work table 29, a distance of approximately eighteen inches in the illustrative embodiment. Movement along this Y axis 22 is effected at relatively high speed, to obtain a satisfactorily high production rate, and this high speed is made possible, in part, because movement of the chuck assembly 21 along the axis 23, which is a transverse horizontal axis referred to hereinafter as the X axis, is restricted to a relatively small maximum displacement. This restriction of X-axis displacement not only minimizes the mass to be moved at high speeds along the Y axis 22, but also ensures higher positional accuracy in both the X and Y directions.

Movement along the axis 24, a vertical axis referred to hereinafter as the Z axis, is, of course, required to provide movement of the chuck assembly 21 in a vertical direction to pick up chips from the feed table 27 and place them down on the substrate 28. Rotational movement of the chuck assembly 21 allows proper angular orientation of a chip on the substrate 28, and may also be required, as will be later described in detail, for applying the adhesive or solder paste to two faces of a chip. Such rotational movement is referred to herein as movement "in the R axis 26", although it will be understood that rotation is not, strictly speaking, in any axis, but is rather about the Z axis 24.

Movement of the work table 29 supporting the substrate 28 is referred to herein as movement in the S axis 31, which is a horizontal axis parallel to the X axis 23, and is required because only a restricted movement is obtainable along the X axis. Movement in the S axis 31 combined with movements of the chuck assembly 21 in the Y axis 22 and R axis 26 allow the location and orientation of chips at any point on the work table 29.

In the presently preferred embodiment of the invention, translation in the direction of the Y axis 22 is effected by means of a direct-current servomotor 34 (see FIG. 15) to obtain the necessary high speed, and translation in the Z axis 24, X axis 23, R axis 26 and S axis 31, are effected by digital stepper motors 35–38, respectively, which obviate the need for positional encoding devices but provide absolute digital accuracy.

Movements of the chuck assembly 21 and the work table 29 are directed by a control unit, indicated generally by the numeral 39 (FIG. 1) and illustrated in more detail in FIGS. 15-18. The control unit 39 includes a control panel 40 with plurality of manual controls and indicator lights which allow an operator to control the movements of the chuck assembly 21 and work table 29 so that a desired assembly process can be "walked through" at slow speed under operator control in a so-called program mode. Then the adjustments and control settings made by the operator during the walk through can be transferred to memory within the control unit 39, and subsequently used to repeat the assembly sequence at high speed, but without any sacrifice in accuracy.

With the use of this programming technique, intermediate processing of chips between pick-up from the feed table 27 and placement on the substrate 28 is relatively easy to accomplish. In the presently preferred embodiment of the invention, apparatus for intermediate processing includes a dip station 41 for the application of a coating of adhesive or solder paste to one or more faces of a chip. Basically, the coating is applied by moving the chip through a layer of the coating material on a dip wheel 42, which is rotating while partially immersed in a dip bath 43, as will be explained in detail with regard to FIGS. 7-10.

In the paragraphs that follow, a detailed description of the mechanical structure which effects movement of the chuck assembly 21 and work table 29 in the Y axis 22, X axis 23, Z axis 24, R axis 26, and S axis 31 is given, together with a detailed description of the control elements which allow proper timing and sequencing of these movements as well as the storage and retrieval of particular sequences or programs of movements.

As can be seen from FIG. 1, the feed table 27 and work table 29 are arranged in a spaced, generally horizontal relationship to each other, with the dip station 41 situated between them. The chuck assembly 21, including a vacuum-operated chuck 44, is cantilevered to overhang the feed table 27 and work table 29, and is movable in any of three directions along the Y, X and Z axes 22–24, respectively, as previously described. The feed table 27 may include any conventional means for feeding small components in correct orientation. In the illustrative embodiment, the feed table, 27 has a plurality of generally parallel slots 46 therein, of various sizes to accommodate various sizes of chips, and all parallel with the X axis 23. The chips are fed toward one end of the feed table 27, as shown by the arrow 47, by vibratory means attached to the table, and a cover sheet 48 retains the chips in their proper slots 46.

Figure 2:
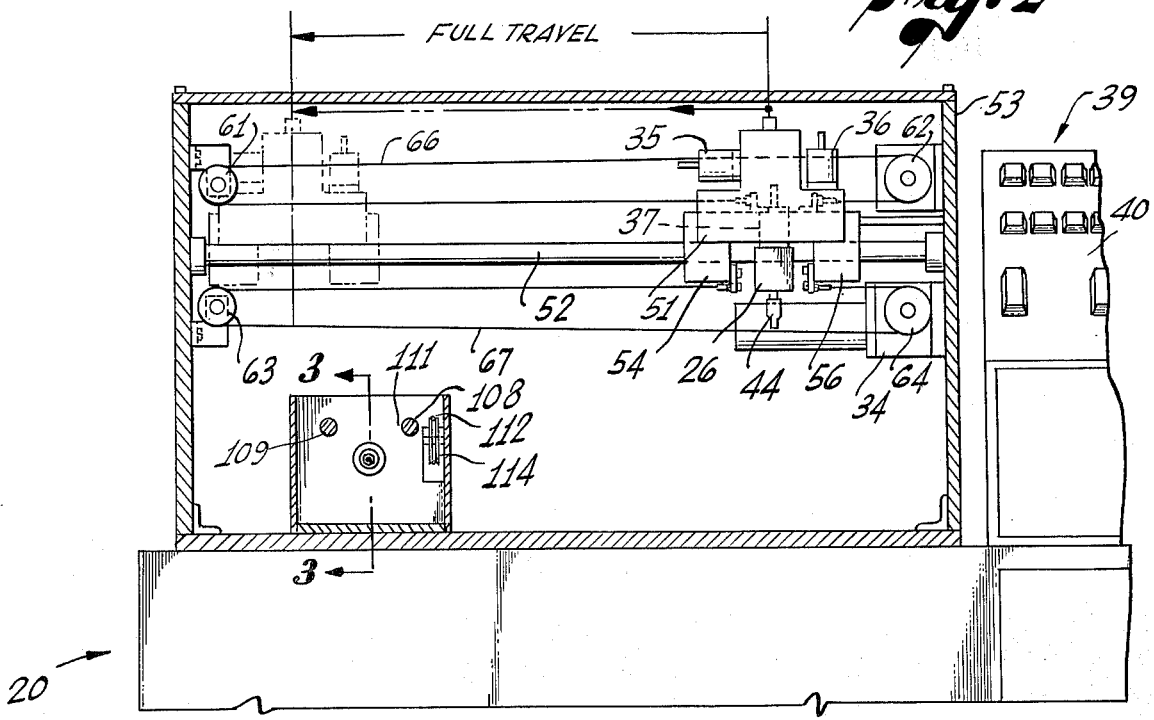
FIG. 2 is an enlarged, front-elevational view of a portion of the machine of FIG. 1 with the front cover plates removed.

As shown in FIG. 2, the chuck assembly 26 is carried on a chuck carriage 51 which is, in turn, supported for movement in the direction of the Y axis 22 (FIG. 1) on a rod 52 rigidly mounted on a fixed frame 53. The rod 52 is parallel to the Y axis 22 (FIG. 1), and the chuck carriage 51 is slidingly supported thereon by means of two bearing blocks 54 and 56.

Figure 11:
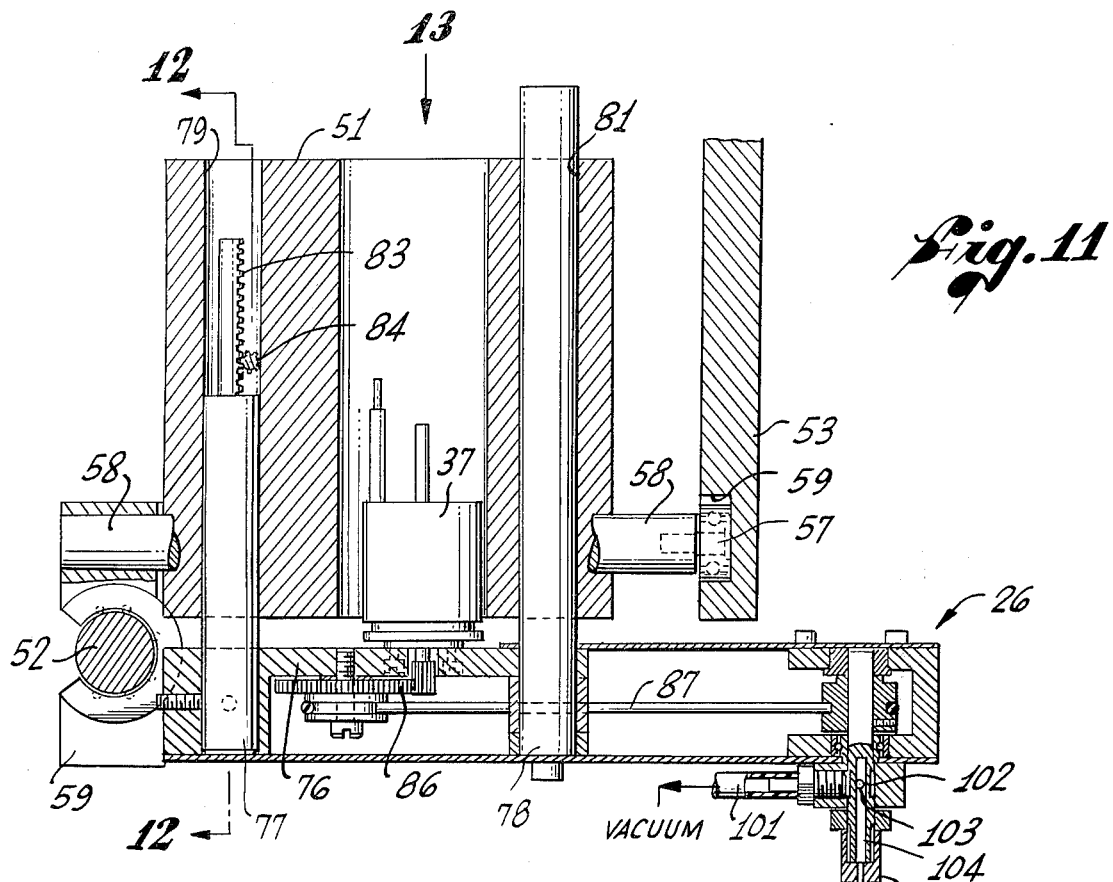
FIG. 11 is a side-elevational view, taken generally in the direction shown by the line 11—11 in FIG. 1 and shown partly in cross-section, of a chuck carriage mechanism employed in the machine of FIG. 1.

As can best be seen in FIG. 11, the chuck carriage 51 is also supported at a third point, specifically by means of a bearing wheel 57 rotatably fitted at the end of a transverse horizontal shaft 58 secured to the carriage, the bearing wheel being sized for rolling contact with a horizontal slot 59 in the frame 53. In the axis terminology previously established, the bearing wheel 57 is rotatable about an X-axis direction, and rolls along the slot 59 in a Y-axis direction to provide, in combination with the bearings 54 and 56, a stable, three-point support system for the chuck carriage 51.

As FIG. 2 further shows, the chuck carriage 51 is propelled back and forth along the Y axis 22 (FIG. 1) by means of an upper pair of pulleys 61 and 62, a lower pair of pulleys 63 and 64, and two, upper and lower, pulley cables 66 and 67, respectively. Each pair of pulleys is arranged in a horizontal relationship parallel to the rod 52, with the pulley cable 66 and 67 each extending around a corresponding pair of the pulleys, and being secured to the chuck carriage 51 so that rotation of the pulleys effects movement of the chuck carriage along the rod 52 in the direction of the Y axis 22 (FIG. 1). In the illustrative embodiment, one of the lower pulleys 64 is drivably connected with the d.c. servomotor 34 to provide the necessary motive power to move the chuck carriage 51 along the Y axis 22 (FIG. 1).

As shown in FIG. 2, the chuck carriage 51, carries with it three other drive motors: the Z-axis stepper motor 35, the X-axis stepper motor 36 and the R-axis stepper motor 37. The mechanical structure relating to these three motors will now be described in detail, with particular reference to FIGS. 11–14.

Figure 12:
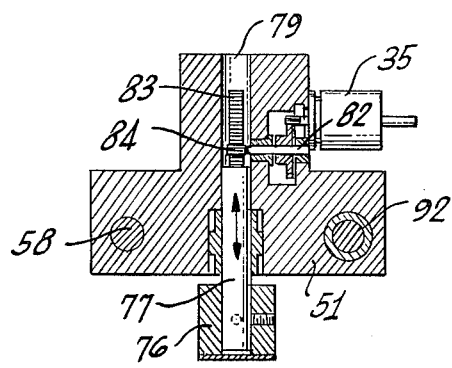
FIG. 12 is a cross-sectional view, at a reduced scale, taken substantially along the line 12—12 in FIG. 11.

As best shown in FIG. 11, the chuck assembly 26 is cantilevered on a supporting frame 76 which is secured to two vertically extending shafts 77 and 78, which, in turn, are slidingly fitted in corresponding cylindrical bores 79 and 81, respectively, in the chuck carriage 51. As best shown in FIG. 12, the Z-axis stepper motor 35 is mounted on the chuck carriage 51 adjacent the cylindrical bore 79, and is connected with the shaft 77 through a suitable reduction gearing 82 and a rack and pinion gear 83 and 84, the rack 83 being connected to the shaft 77, to effect movement of the chuck assembly 26 in the Z-axis or vertical direction in response to rotation of the Z-axis stepper motor 35.

As FIG. 11 further shows, the R-axis stepper motor 37 is mounted on a vertical axis on the chuck assembly supporting frame 76, and is connected through reduction gearing 86 and a belt drive 87 to effect a rotation of the chuck 44 in response to rotation of the R-axis stepper motor 37.

Figure 13:
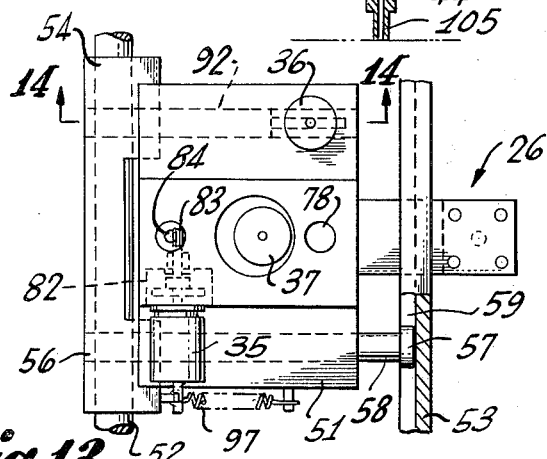
FIG. 13 is a plan view, at a scale reduced further from FIG. 12, taken generally in the direction indicated by the arrow 13 in FIG. 11.
Figure 14:
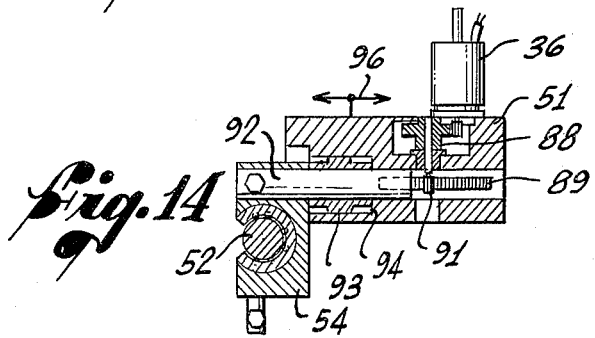
FIG. 14 is a cross-sectional view taken substantially along the line 14—14 in FIG. 13.

As best shown in FIGS. 13 and 14, movement of the chuck assembly 26 in the direction of the X axis 23 (FIG. 1) is accomplished by means of the X-axis stepper motor 36, another reduction gear 88, and another rack and pinion gear 89 and 91. The chuck carriage 51 is supported on the Y-axis bearing block 54 by means of a rod 92 secured to the bearing block, and a bearing collar 93 secured to the rod and slidingly engaged in a bore 94 in the chuck carriage, to allow limited movement thereof in the X-axis direction. A similar arrangement supports the chuck carriage 51 in the other Y-axis bearing block 56.

The rack 89 is secured to the rod 92 and the pinion 91 is drivably connected to the X-axis stepper motor 36, which is mounted on the chuck carriage 51. Thus, on rotation of the X-axis stepper motor 36, the chuck carriage 51 is moved in the X-axis direction, as shown by the arrows at 96 in FIG. 14. A tension spring 97 (FIG. 13) between the chuck carriage 51 and the bearing block 56 urges the chuck carriage toward a fully-retracted position.

The chuck 44 (FIG. 11) is a vacuum operated chuck of conventional design. Vacuum is applied through a connecting tube 101 which communicates with an annular space 102 in the chuck assembly 26. The annular space 102 is connected through a radial hole 103 to a central passage 104 which, in turn, communicates with the tip 105 of the chuck 44.

The remaining axis to be described is the socalled S axis on which the work table 29 is moved in a direction parallel to the X axis 23. As can best be seen in FIGS. 3–6, the work table 29 is supported by two bearing blocks 106 and 107 on two parallel shafts 108 and 109, respectively, both shafts being oriented in the X-axis direction and secured to a housing 111 which is itself rigidly mounted on the frame 53. A cable 112 is secured to one of the bearing blocks 107 and is driven around a pair of pulleys 113 and 114 by the S-axis stepper motor 38, which is drivably connected to the pulley 114 through a worm gear drive 115 (FIG. 3). Thus, the work table 29 is movable along the S-axis as indicated by the arrows 116 (FIG. 6), in response to rotation of the S-axis stepper motor 38.

A vacuum is applied through a line 117 to holes 118 through the work table 29 to hold substrate elements positively on the table. A manually actuable valve 119 is used to control application of the vacuum to the work table 29, to allow an operator to hold or release substrates on the table.

As shown in FIGS. 7–10, at the dip station 41 (FIG. 1), the dip wheel 42 is rotated on a horizontal axis parallel to the X axis, and is partially immersed in epoxy adhesive or solder paste 121. The wheel 42 is continuously driven by a separate motor 122, and is substantially cylindrical in shape except for two circumferential grooves 123 and 124 at the circumferential corners or edges of the wheel. The grooves 123 and 124 may be of different sizes, as they are in the illustrative embodiment, to accommodate different sizes of chip. The grooves 123 and 124 are filled with solder paste in the dip bath 43, and any unwanted excess of paste is continuously scraped off by a springloaded blade 126 (FIGS. 7 and 8).

Some chips, such as capacitor chips, may be required to be coated on two opposite edges with solder paste. This can be effected by making two passes through one of the grooves 123 and 124, as shown in FIG. 10, with the chuck assembly 26 (FIG. 1) being programmed to rotate 180° between the passes, as shown diagrammatically at 127 (FIG. 10). It should also be noted that paste may be applied to the bottom surface of a chip by passing the chip directly over the wheel 42 rather than through one of its grooves.

Figure 15:
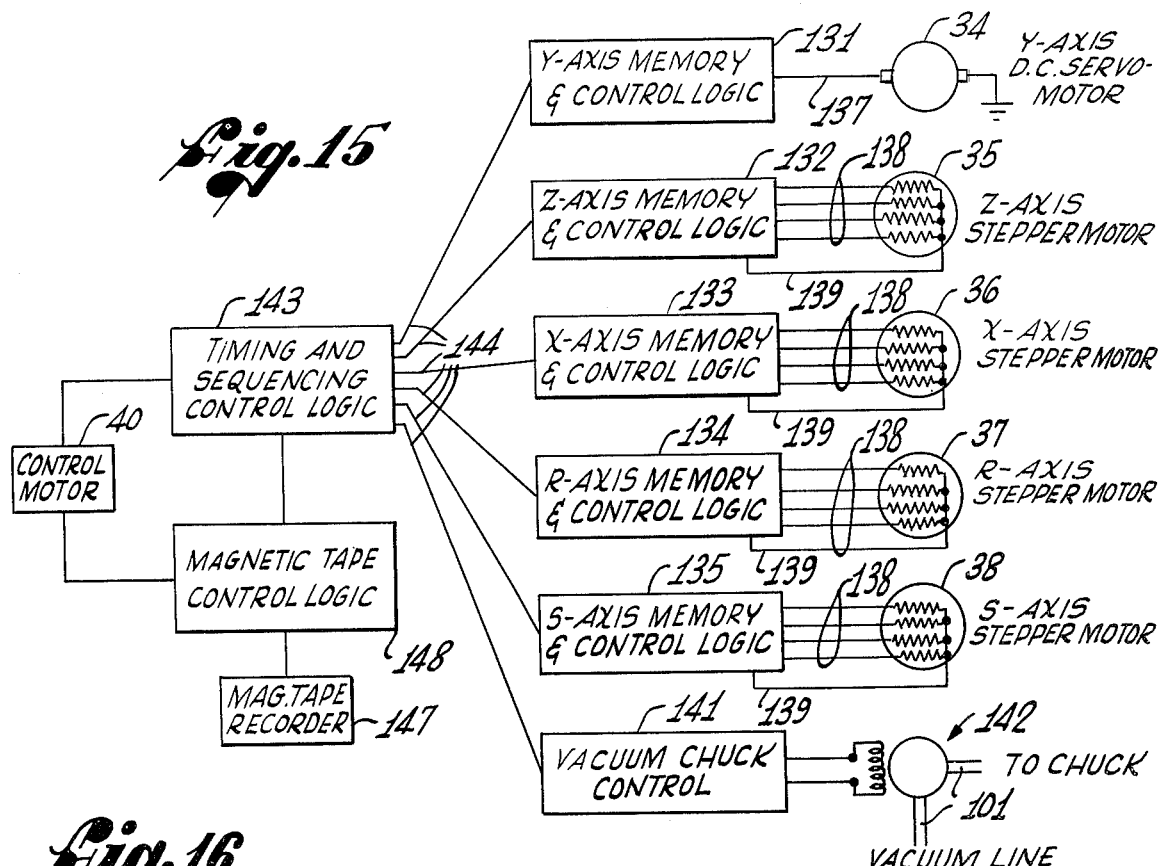
FIG. 15 is a block diagram of the basic control system employed with the machine illustrated in FIGS. 1–14.

FIG. 15 shows the basic control system utilized in the apparatus of the present invention. Associated with each axis is a storage or memory, and some control logic for generating signals to initiate movement in that axis, in response to the contents of the memory and to various other control signals. Thus the basic control system includes Y-axis memory and control logic 131, and corresponding memory and control logic for the Z axis (132), X axis (133), R axis (134) and S axis (135). The Y-axis memory and control logic is operative to control the Y-axis d.c. servomotor 34, as indicated by line 137. The memory and control logic for the other axes are operative to control their respective stepper motors 35–38, which are conventional four-phase stepper motors as indicated by the four leads 138 to each stepper motor. The additional lead 139 to each stepper motor is a power lead, and is shown connected to each of the memory and control logic units because, as will be later described, the voltage applied to each stepper motor is in part controlled by the memory and control logic for that motor.

Also included in the basic control system is a vacuum chuck control 141, to control the connection of the vacuum line 101 to the chuck 44 (FIG. 2) through an electrically actuated valve 142.

The vacuum chuck control 141 and the memory and control logic 131–135 for the respective axes are controlled by timing and sequencing control logic 143, as indicated diagrammatically by the control lines 144. The timing and sequencing control logic 143 provides clock signals to the memory and control logic and controls the sequence of steps by which movements are made in the various axes. Operator control is provided at the control panel 40, by means of which an operator may walk through the movement steps of the chuck assembly 26 and work table 29, recording the program as thus generated to the various axis memories 131–135, and subsequently initiating automatic execution of this program. Also included are a magnetic tape recorder 147 and associated magnetic tape control logic 148, providing for permanent storage of operator-generated programs of chuck movements.

The Y-axis memory and control logic 131 differs from the equivalent logic for control of the other axes in that the d.c. servomotor 34 is used, rather than a stepper motor, to provide fast movement over the longest axis of travel, and also because movement along the Y-axis 22 (FIG. 1) at the dip station 41 (FIG. 1) has to be at a controlled speed to effectively control the application of the adhesive or solder paste coating 121. Consequently, the Y-axis memory and control logic 131 is separately illustrated, in FIG. 17. The memory and control logic for the other axes (132–135) are basically the same as each other, and are typified by the logic illustrated in FIG. 18.

Figure 17:
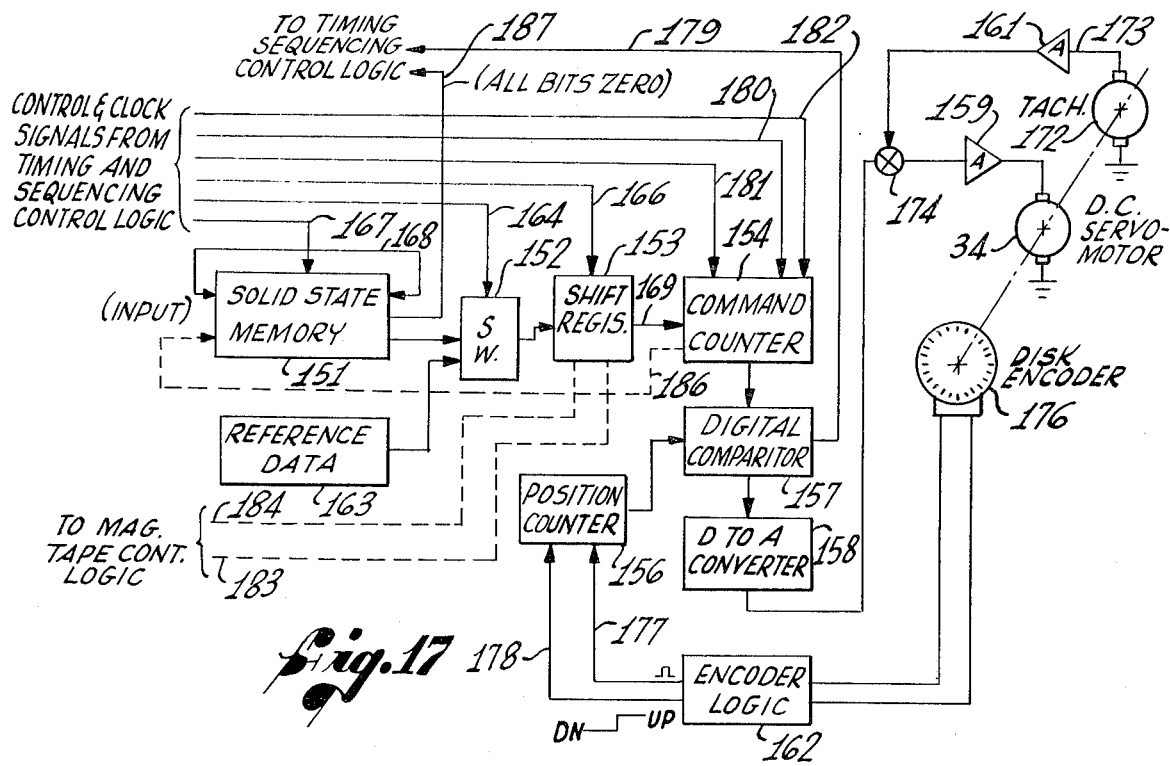
FIG. 17 is a block diagram showing the memory and control logic for movements in a horizontal axis referred to herein as the Y axis.

The Y-axis memory and control logic 131, illustrated in FIG. 17, comprises the following components, the function of which will be shortly explained: a solid-state memory 151, a logical switch 152, a shift register 153, a command counter 154, a position counter 156, a digital comparator 157, a digital-to-analog convertor 158, two amplifiers 159 and 161, encoder logic 162, and a reference data register 163. The solid-state memory 151 is a shift register connected in "wrap around" fashion to form a recirculating memory $m$ bits wide and $n$ bits long, i.e. with the capability of storing $n$ quantities, each $m$ bits in length.

In the case of the Y-axis control logic, the function of the solid state memory 151 is to store a string of numbers representative of programmed positions on the Y-axis. The function of most of the remaining logic shown in FIG. 17 is to generate signals which will move the chuck assembly 26 (FIG. 1) along the Y-axis until its position corresponds with that most recently read from the memory 151 or reference data register 163 into the shift register 153.

The switch 152, controlled by a signal on line 164 from the timing and sequencing control logic 143 (FIG. 15), selects data either from the solid-state memory 151 or the reference data register 163, the latter being an additional solid-state register whose permanent contents are indicative of a non-zero reference position on the Y axis. For certain non-programmable steps or movements of the chuck assembly 26 (FIG. 1), the reference data are used to return the chuck assembly to the Y-axis reference position, which happens to be the starting point for dip station operations.

For programmable steps in the Y axis, the switch 152 allows passage of data from the memory 151 to the shift register 153 when an appropriate memory clocking signal is impressed on line 166 to the shift register. Another clocking signal on line 167, to the memory 151, recirculates the memory by one position, as shown by line 168. The contents of the shift register 153 are gated over line 169 into the command counter 154, which indicates a desired position on the Y axis. The contents of the command counter 154 are continuously compared with the contents of the position counter 156, which indicates actual position on the Y axis, in the digital comparator 157. Digital difference signals generated by the digital comparator 157 on line 171, are converted to analog form in the digital-to-analog converter 158, amplified by the amplifier 159 and used to control the d.c. servomotor 34 to initiate an appropriate movement on the Y axis. A feedback loop is provided to minimize overshoot, wherein a tachometer 172 on the same shaft as the servomotor 34 provides an electrical signal on line 173 for amplification by the amplifier 161, and summing with the output of the digital-to-analog converter 158, as shown at 174.

Also on the same shaft as the servomotor 34 is a disk encoder 176, which, with the encoder logic 163 produces pulses on line 177 and on up/down signal on line 178 to update the contents of the position counter 156. When the digital comparator 157 finds equality between the desired and actual positions, a null signal is generated on line 179.

The command counter 154 may also receive control signals from the timing and sequencing logic 143 (FIG. 15), over lines 180 and 181, namely a direction signal on line 180 and one or more clock pulses on line 181. These control signals may be used to manually control movement in the Y axis. Further control signals on line 182 from the timing and sequencing control logic 143 (FIG. 15), are used to initiate movement along the Y axis at a specially controlled speed, as for the dip station operations.

The broken lines 183 and 184 connected with the shift register 153 indicate the flow of data to and from the tape recorder 147 (FIG. 15) when it is used as permanent storage to receive or originate Y-axis data. This is not absolutely necessary in order to control the apparatus of the present invention, and is mentioned only in passing. More important is the data path shown as a broken line 186 between the position counter 156 and the solid-state memory 151. When the operator has adjusted the Y-axis position to a desired setting for a certain programmable step, he may manually initiate transfer of the Y-axis actual position in counter 156 to the memory 151 over the line 186. Finally with regard to the Y-axis control, it should be noted that an all-bits-zero signal is generated on line 187 when a zero quantity is read from the memory 151. This condition is used to mark the beginning of the memory 151, and enables all memories in the system to be reset to a starting point even though they are of generally different lengths.

The corresponding memory and control logic for the four remaining axes (Z, X, R and S) differ from the aforedescribed Y-axis memory and control logic 131, basically because the stepper motors 35–38 are used to effect movement in these four axes rather than the d.c. servomotor 34 associated with the Y-axis.

Figure 18:
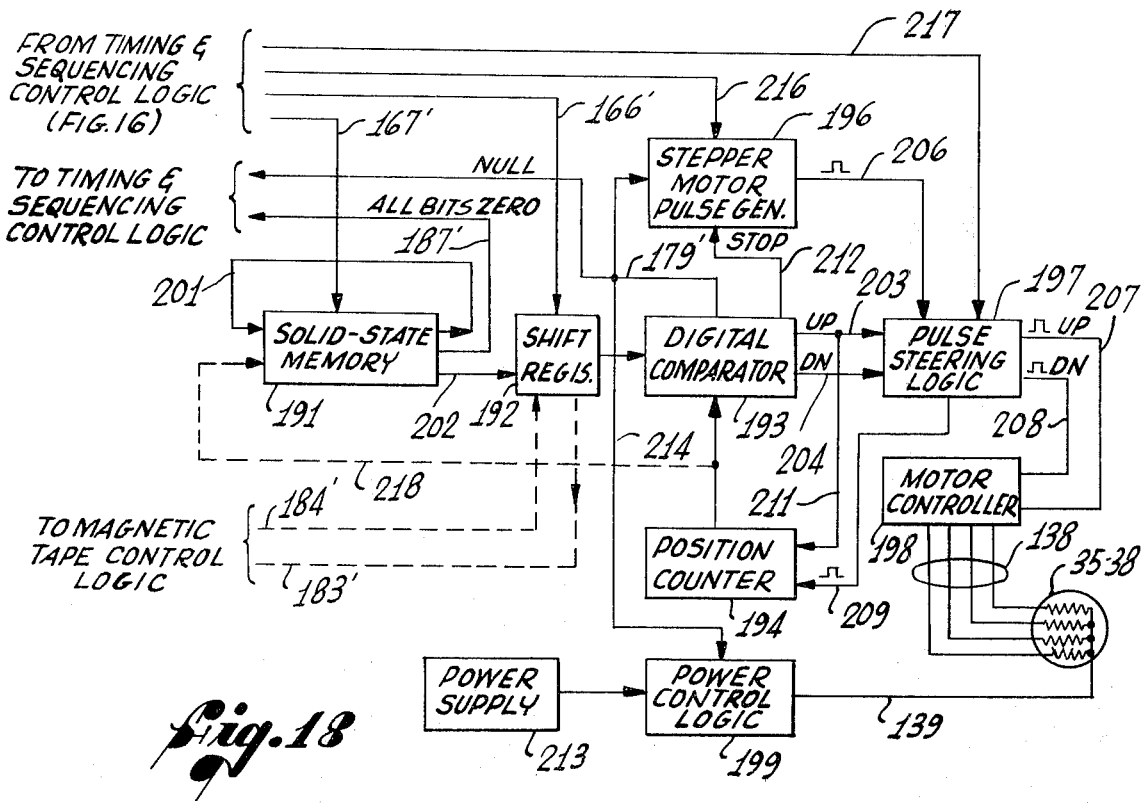
FIG. 18 is a block diagram showing the memory and control logic for movement in axes other than the Y-axis.

As shown in FIG. 18, the memory and control logic for each of the Z, X, R and S axes includes a solid-state memory 191, a shift register 192, a digital comparator 193, and a position counter 194, all of which have much the same function as their counterparts shown in FIG. 17 for Y-axis control. Also included are a stepper motor pulse generator 196, pulse steering logic 197, a motor controller 198 and power control logic 199.

As in the Y-axis logic of FIG. 18, the solid-state memory 191 is a wrap-around shift register for storing successive programmable positions for each axis. The memory 191 may be of different bit sizes for each of the four different axes, depending on the specific storage requirements for movements relating to each axis in a complete program or sequence of assembly operations. The memory 191 is recirculated one storage position, as indicated by line 201, by an appropriate clock pulse on line 167' from the timing and sequencing control logic 143 (FIG. 15). (The primed reference numerals in FIG. 18 are used to refer to signal lines for which there are counterparts with similar functions in FIG. 17, the latter being referred to by corresponding unprimed numerals.)

A clock signal on line 166' to the shift register 192 clocks a digital quantity from the output of the memory 191 into the shift register over line 202, and this quantity is continuously compared with the contents of the position counter 194, indicative of the actual position, in the digital comparator 193. When exact equality is found between the compared digital quantities, a null signal is generated on the line 179' from the digital comparator 193. If inequality is found, an "up" or a "down" signal is generated on lines 203 or 204, respectively, and is transferred to the pulse steering logic 197. The stepper motor pulse generator 196 outputs pulses over line 206 to the pulse steering logic 197, whose function is to generate up pulses on line 207 or down pulses on line 208, as directed by the up or down signals supplied from the digital comparator 193. The up or down pulses are transmitted over lines 207 and 208, respectively, to the motor controller 198, which generates appropriate signals on lines 138 to the stepper motor itself.

Pulses from the pulse steering logic 197 are also applied to the position counter 194, over line 209, together with an up signal over line 211. Thus, the position counter 194 always reflects the actual position in the particular axis. The digital comparator 193 also generates a so-called "stop" signal when the difference between the actual and desired positions reaches some selected small value. The stop signal is transmitted over line 212 to the stepper motor pulse generator 196, and is used to slow the frequency of pulses output over line 206 to the pulse steering logic 197 as the desired position in the axis is approached. The stepper motor pulse generator 196 is also designed to start generating pulses at a low frequency and to increase rapidly to a maximum. This, together with the slow-down feature just described, takes advantage of a high stepping rate for maximum speed of movement, yet allows starting and stopping of large inertia loads.

Another design feature is that, the voltage applied to the stepper motor (35-38) over line 139 is substantially reduced when the desired position is reached, to minimize unnecessary overheating of the motor. This control of voltage from a power supply 213 is effected in the power control logic 199 by means of the null signal conveyed to the power control logic over line 214.

The pulse steering logic 197 is also controllable in a manual or program mode whereby the pulses received over line 206 are controlled in part by a manually-originated control signal over line 216 from the timing and sequencing control logic 143 (FIG. 15), and the up/down direction is also manually-originated over line 217. In the program mode, when a desired position is reached by this means, operation of an appropriate control records the position in the solid-state memory 191, as indicated by the broken line 218.

As mentioned previously, the solid-state memory 191 may be of different lengths for each axis. Consequently, some means has to be provided for resetting the memories 191 (FIG. 18) and 151 (FIG. 19) to a starting position. The means used in the presently preferred embodiment was mentioned with regard to the X-axis memory 151 (FIG. 17), and involves the use of an all-zero word as the starting or reference point for each memory. The detection of all-bits-zero is indicated on line 187' for transmission back to the timing and sequencing control logic 143 (FIG. 15).

Figure 16:
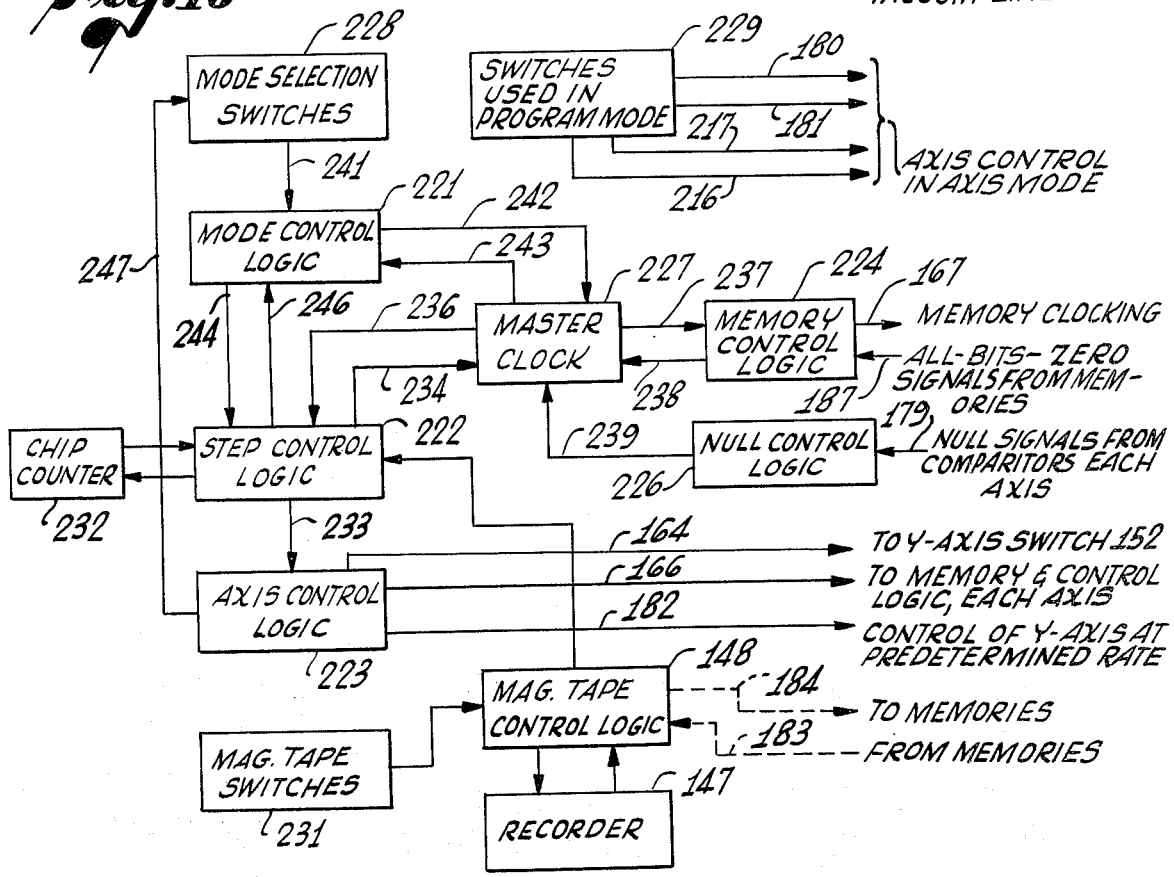
FIG. 16 is a block diagram showing the timing and sequencing control logic included in FIG. 15.

FIG. 16 shows the basic modules of the timing and sequencing control logic 143 (FIG. 15) and their relationship with each other and with the other elements of the control system for the invention. The timing and sequencing control logic comprises a number of basic logic modules: mode control logic 221, step control logic 222, axis control logic 223, memory control logic 224, null control logic 226, and a master clock 227. In addition, there are various control switches included on the control panel 40; in particular, mode selection switches 228, switches 229 used in program mode, and magnetic tape control switches 231. A chip counter 232 is connected to the step control logic 222, and is used by the step control logic to count the number of chips placed on one or more substrates in a single programmed sequence, the number being determined by the operator and set in switches (not shown) on the control panel 146 (FIG. 15).

In the basic scheme used in sequencing movements of the chuck assembly 21 and work table 29 (FIG. 1), the movements are divided into steps, each of which is a movement in just one axis, and the completion of one step allows initiation of the next. The master clock 227 generates clock pulses for recirculating the various axis memories 151 and 191 (FIGS. 17 and 18), and for gating data from the memories to the respective shift registers 153 and 192 (FIGS. 17 and 18). The master clock 287 does not continuously generate output pulses, but is turned on and off as required for the execution of each step.

The step control logic 222 keeps track of which step is currently being performed and passes this information over line 233 to the axis control logic 223, which, in turn transmits a control signal to the appropriate axis over the line 166. The axis control logic 223 also controls Y-axis movements at a predetermined rate during certain steps, as indicated by line 182, and controls the Y-axis switch 152 (FIG. 17) by means of which the chuck assembly 21 (FIG. 1) is moved to a reference position in the Y-axis.

The step control logic 222 communicates with the master clock 227 over lines 234 and 236, which, in turn, communicates with the memory control logic 224 over lines 237 and 238. When a step is completed, the null control logic 226, which receives null signals over lines 179 from the various axes, generates an appropriate signal on line 239 to the master clock 227, and the next step may begin.

The mode control logic 221 receives switch-setting information from the mode selection switches 228 as indicated by line 241, and communicates with the master clock over lines 242 and 243, with the step control logic 222 over lines 244 and 246, and with the axis control logic 223 over line 247. Basically, the mode selection switches 228 allow operations to be performed in either a step mode, in which the chip assembly machine stops after each step and has to be restarted with a start button (not shown); a chip mode, in which the machine proceeds automatically through all the steps in the placement of one chip before stopping; an automatic mode, in which the machine proceeds automatically until all the chips, as counted by the chip counter 232, have been placed on the substrate; and the previously mentioned program mode, in which the machine stops at the end of each programmable step to allow positional adjustment on the appropriate axis and transfer of the adjusted position to memory. In this connection, it will be appreciated that not all of the steps in a sequence will be programmable steps, since some will involve turning the vacuum chuck 44 (FIG. 2) on or off, or will involve return to a standard or reference position in that axis.

Included for use with the mode selection switches 228 is a multiple function start/stop/remember switch (not shown). It is used to start or stop the machine when running in other than program mode and to record a manually selected position of a programmable step when in program mode. The switches 229 used in program mode are axis speed and direction controls which allow control of movement in whichever axis is selected for a particular programmable step.

It will be appreciated that the control or signal lines shown in FIG. 16 are, in many instances diagrammatic, and that a plurality of lines is in fact required for actual implementation of the illustrated control system. The invention as claimed herein could be practiced using a wide variety of control schemes, and the one described and illustrated, herein is, of course, by way of example only. Complete logic diagrams of the entire control system utilized with the present invention, and a "to-from" wirelist using nomenclature consistent with that of the diagrams, are attached hereto as an appendix.

The specific sequence of steps performed in picking up and placing a plurality of chips would, of course, vary according to the requirements of a particular chip assembly process. In the presently preferred embodiment of the invention, a sequence of 30 steps is available, three of which are spare steps presently unused. The sequence is listed below, and will also serve as a summary of the operation of the invention.

Step 0: Ready position; the starting position for normal operation, with all axes in a reference or zero position.

Step 1: Move in the Y axis to a chip on the feed table 27 (FIG. 1).

Step 2: Move the work table 29 (FIG. 1) to the desired position in S axis. This is an exception to the general sequential mode of operation. Movement in the S axis is initiated in this step and completed in step 20, described below, to provide a time-saving overlap with movements in the other axes.

Step 3: Move the chuck 44 (FIG. 2) in the X axis to the approximate center of the chip to be picked up.

Step 4: Move the chuck 44 (FIG. 2) in the Z axis to touch the chip.

Step 5: Turn the vacuum on to pick up the chip.

Step 6: Raise the chuck 44 (FIG. 2) to the Z-axis reference position.

Step 7: Move the chuck 44 (FIG. 2) to the Y-axis reference position near the dip station 41 (FIG. 1).

Step 8: Position the chuck 44 (FIG. 2) on the X axis for dipping.

Step 9: Position the chuck (FIG. 2) on the Z axis for dipping.

Step 10: Move the chuck 44 (FIG. 2) at a controlled rate past the dip wheel 42 (FIG. 2).

Step 11: Raise the chuck 44 (FIG. 2) to the Z-axis reference position.

Step 12: Rotate the chuck 44 (FIG. 2) 180 degrees in the R axis.

Step 13: Return the chuck 44 (FIG. 2) to the Y-axis reference position near the dip station 41 (FIG. 1).

Step 14: Position the chuck 44 (FIG. 2) in the X axis for dipping a second side of the chip.

Step 15: Position the chuck 44 (FIG. 2) in the Z axis for dipping the second side of the chip.

Step 16: Move the chuck 44 (FIG. 2) at a controlled rate past the dip wheel 42 (FIG. 1).

Step 17: Raise the chuck 44 (FIG. 2) to the Z-axis reference position.

Step 18: Move the chuck 44 (FIG. 2) to the X-axis reference position.

Step 19: Move the chuck 44 (FIG. 2) in the Y axis for placement on the substrate.

Step 20: Rotate the chuck 44 (FIG. 2) in the R axis for orientation with respect to the substrate, and complete the S-axis movement initiated in Step 2.

Step 21: Lower the chuck 44 (FIG. 2) in the Z axis to place the chip on the substrate.

Step 22: Turn the vacuum off to release the chip.

Step 23: Raise the chuck 44 (FIG. 2) to the Z-axis reference position, and reset the step control logic 222 (FIG. 16) for the next chip.

The sequence from steps 1 through 23 is repeated until all required chips in the program, as indicated by the operator, have been placed on one or more substrates. Then step 24 is performed.

Step 24: Recirculate memories 151 and 191 for all axis until all-bits-zero indications are returned from all of them.

Step 25: Return all five axes to their reference positions, i.e. the zero values of position on each of the axes. Note in this regard that the Y axis has another reference position, near the dip station 41 (FIG. 1), as discussed previously.

Steps 26–28: Not used.

Step 29: Halt; reset to step 0 and reset the chip counter 232 (FIG. 16) to zero.

Production rates and the number of chips that can be placed per program will, of course, vary according to specific design choices, such as memory sizes and motor speeds, for example. In the presently preferred embodiment, however, 800 chips per hour can be placed if the dipping step is included, or 1,400 chips per hour without dipping, and memory capacity is such that 30 different chips may be placed by one program of steps as set forth above.

It will be appreciated from the foregoing detailed description that the present invention represents a substantial advance in the art of manufacture of microelectronic or hybrid circuitry. In particular, the arrangement of five axes of movement for the chuck and work table is an optimum one which satisfies the stringent process requirements of speed and accuracy. Moreover, the machine of the invention is easily programmable by a relatively unskilled operator, and is, therefore, well suited for short and medium production runs as well as longer production runs.

Although a particular embodiment of the invention has been described in detail for purposes of illustration, it will be appreciated that various modifications may be made without departing from the spirit and scope of the invention. Accordingly, the invention is not to be limited, except by the appended claims.

I claim:

1. In a programmable manipulator for the sequential placement of a plurality of component parts on a work-piece, the combination comprising:
    a pickup station, including means for feeding the component parts;
    an assembly station including a work table for supporting at least one work-piece;
    chuck means for releasably holding a component part for transfer from said pick-up station to said assembly station;
    means for moving said chuck means rapidly along a first axis between said pick-up station and said assembly station;
    means for moving said chuck means along second and third axes generally orthogonally related to said first axis;
    means for rotating said chuck means about one of said three axes;
    means for moving said work table along a fourth axis substantially perpendicular to said first axis, whereby movement in said fourth axis allows positioning of a component part over a wide area of said work table without having to provide for large displacements of said chuck means in a direction parallel to said fouth axis; and
    control means for automatically controlling the operation of said chuck means, said means for moving and rotating said chuck means and said means for moving said work table, all in accordance with a predetermined sequence of steps selectable and adjustable under operator control.

2. The combination as set forth in claim 1, wherein;
    said first axis is horizontal;
    said second axis is horizontal but allows only limited movement;
    said third axis is vertical;
    said fourth axis is parallel to said second axis; and
    said chuck means is rotatable about said third axis.

3. The combination as set forth in claim 1, wherein:
    said means for moving said chuck means in said first axis includes a servomotor and position encoding means; and
    said means for moving said chuck means in said second and third axes, said means for rotating said chuck means, and said means for moving said work table in said fourth axis, each include a digital stepper motor.

4. The combination as set forth in claim 1, wherein;
    said chuck means includes a vacuum-operated chuck; and
    said control means includes means for applying a vacuum to said chuck to pick up and hold a component part.

5. The combination as set forth in claim 1, further including a dip station located intermediate said pick-up station and said assembly station for the application of a joining paste material to the component parts as they are moved through said dip station.

6. The combination as set forth in claim 5, wherein said dip station includes:
    a paste bath;
    a rotatable dip wheel partially immersed in said bath; and
    at least one circumferential groove around said dip wheel to carry a layer of the paste material for application to the component parts moved past said wheel.

7. In an automatic chip assembly machine for the placement of a plurality of chip components on a substrate, the combination comprising:
    a chip pick-up station, including means for feeding chips of various sizes to a plurality of pick-up locations;
    a chip assembly station, including a substrate table for securely supporting at least one substrate, said chip assembly station being separated horizontally from said chip pick-up station;
    a chuck assembly for releasably holding a chip for transfer from said chip pick-up station to said chip assembly station;
    A chuck carriage for supporting said chuck assembly for movement thereon;
    first motive means, for moving said chuck carriage, and with it said chuck assembly, along a first horizontal axis between said chip pick-up station and said chip assembly station;
    second motive means, for moving said chuck assembly with respect to said chuck carriage along a second horizontal axis generally perpendicular to said first horizontal axis, whereby the extent of movement in said second horizontal axis is limited to an amount sufficient to permit accommodation of a desired range of chip sizes;
    third motive means, for moving said chuck assembly with respect to said chuck carriage along a vertical axis to allow said chuck assembly to be lowered and raised with respect to said pick-up station and said substrate table;
    fourth motive means, for rotating said chuck assembly, with respect to said chuck carriage, about said vertical axis;
    fifth motive means, for moving said substrate table along an axis parallel to said second horizontal axis, whereby chips picked up by said chuck assembly at said chip pick-up station may be transferred to said chip assembly station and accurately placed on a substrate secured to said substrate table by appropriate manipulation of said first, second, third, fourth and fifth motive means; and control means for automatically controlling operations of said chuck assembly and said first, second, third, fourth and fifth motive means, all in accordance with a predetermined sequence of steps selectable and adjustable in part under operator control.

8. The combination as set forth in claim 7, wherein:
said first motive means includes a servomotor coupled with said control means and means for encoding the position of said chuck carriage on said first horizontal axis;
said second, third, fourth and fifth motive means each include a digital stepper motor coupled with said control means.

9. The combination as set forth in claim 7, wherein:
said chuck assembly includes a vacuum chuck; and
said control means includes means for applying a vacuum to said chuck to pick up and hold a chip.

10. The combination as set forth in claim 7, further including a dip station located intermediate said chip pick-up station and said chip assembly station, for the application of a joining paste material to the chips as they are moved through said dip station.

11. The combination as set forth in claim 10, wherein said dip station includes:
a dip bath of the joining paste material;
a dip wheel rotatable about an axis parallel to said second horizontal axis and partially immersed in said dip bath;
drive means for rotating said dip wheel; and at least one circumferential groove around said dip wheel to carry a layer of the paste material for application to chips moved at a controlled speed along said first horizontal axis and generally tangentially to said dip wheel.

12. In an automatic chip assembly machine for the placement of a plurality of chip components on a substrate, the combination comprising:
a machine frame;
a chip pick-up station, including a feed table for feeding chips of various sizes to a plurality of pick-up locations;
a chip assembly station, including a substrate table for securely supporting at least one substrate, said chip assembly station being separated horizontally from said chip pick-up station,
a vacuum-operated chuck assembly for releasably holding a chip for transfer from said chip pick-up station to said chip assembly station;
a chuck carriage for supporting said chuck assembly for movement in a horizontal axis between said chip pick-up station and said chip assembly station;
first mounting means, for mounting said chuck carriage on said frame for sliding movement in said horizontal axis;
second mounting means, for mounting said chuck assembly on said chuck carriage for sliding movement with respect to said chuck carriage in a transverse horizontal axis;
third mounting means, for mounting said chuck assembly on said chuck carriage for sliding movement with respect to said chuck carriage in a vertical axis;
fourth mounting means, for mounting said chuck assembly on said chuck carriage for rotation about the vertical axis;

fifth mounting means, for mounting said substrate table on said frame for sliding movement in a transverse horizontal direction;
first motive means, for moving said chuck carriage on said first mounting means;
second, third and fourth motive means, for moving said chuck assembly on said second, third and fourth mounting means, respectively;
fifth motive means, for moving said substrate table on said fifth mounting means;
a dip station intermediate said chip pick-up station and said chip assembly station, said dip station including a dip bath and a dip wheel for transferring a joining paste material to the chips; and
control means for automatically controlling operations of said chuck assembly and said first, second, third, fourth, and fifth motive means, all in accordance with a predetermined sequence of steps selectable and adjustable in part under operator control, said control means including memory means associated with each of said motive means, and comparison means, also associated with each of said motive means, for comparing a desired position on an axis, as obtained from said memory means with an actual position and generating therefrom control signals for transmission to said motive means.

13. For use in an automatic chip assembly machine, a method for assembling a plurality of chips on substrates, comprising the steps of:
picking a chip from a pick-up station by moving a chuck as required along three orthogonally-related axes and actuating the chuck to grip the chip;
raising the chip from the pick-up station;
moving the chip rapidly along a horizontal axis to a desired position on a work table supporting the substrate;
positioning the chip with respect to the substrate by lowering the chuck and moving the substrate table along a transverse horizontal axis;
releasing the chip;
performing manual positional adjustments at each of said aforementioned steps;
repeating said aforementioned steps in order to place a plurality of chips on the substrate at different desired positions; and
automatically repeating said foregoing steps, except for said step of performing manual positional adjustments, as many times as desired to produce a plurality of substrate assemblies.

14. A method as set forth in claim 13, wherein said positioning step includes rotating the chip about a vertical axis to a desired angular orientation with respect to the substrate.

15. A method as set forth in claim 13, further including the step of coating at least one face of the chip with a joining paste material by passing it through a dip station during said step of moving the chip rapidly along said horizontal axis.

16. A method as set forth in claim 15, wherein said coating step is effected by moving the chip at a controlled speed tangentially to a dip wheel carrying a circumferential layer of the paste material.

17. A method for assembling a plurality of chips on a substrate, comprising the steps of:
picking a chip from a pick-up station by moving a chuck as required along three orthogonally-related axes and actuating the chuck to grip the chip;

raising the chip from the pick-up station;

moving the chip rapidly along a horizontal axis to a desired position on a work table supporting the substrate;

coating at least one face of the chip with a joining paste material by passing it through a dip station during said step of moving the chip rapidly along said horizontal axis, wherein said coating step is effected by moving the chip at a controlled speed tangentially to a dip wheel carrying a circumferential layer of the paste material;

rotating the chip through 180° after said coating step;

moving the chip through the dip station a second time to coat a second face of the chip with the paste;

positioning the chip with respect to the substrate by lowering the chuck and moving the substrate table along a transverse horizontal axis;

releasing the chip; and repeating the aforementioned steps in order to place a plurality of chips on the substrate at different desired positions.

* * * * *